United States Patent [19]
Reinhard et al.

[11] Patent Number: 6,077,787
[45] Date of Patent: Jun. 20, 2000

[54] METHOD FOR RADIOFREQUENCY WAVE ETCHING

[75] Inventors: Donnie K. Reinhard; Rabindra N. Chakraborty, both of East Lansing; Jes Asmussen, Okemos, all of Mich.; Paul D. Goldman, Marlboro, Mass.

[73] Assignees: Board of Trustees operating Michigan State University, East Lansing, Mich.; Saint-Gobain/Norton Industrial Ceramics Corporation, Northboro, Mass.

[21] Appl. No.: 08/533,562

[22] Filed: Sep. 25, 1995

[51] Int. Cl.$^7$ .................................................. H01L 21/311
[52] U.S. Cl. .............................. 438/697; 216/38; 216/58; 216/63; 216/67; 216/69; 216/70; 438/105; 438/706; 438/710; 438/720; 438/735; 438/964
[58] Field of Search .................................. 216/38, 58, 63, 216/67, 69, 70; 438/105, 697, 706, 710, 720, 735, 964

[56] References Cited

U.S. PATENT DOCUMENTS

| | | |
|---|---|---|
| 4,507,588 | 3/1985 | Asmussen et al. . |
| 4,691,662 | 9/1987 | Roppel et al. . |
| 4,727,293 | 2/1988 | Asmussen et al. . |
| 5,081,398 | 1/1992 | Asmussen et al. . |
| 5,311,103 | 5/1994 | Asmussen et al. . |
| 5,324,388 | 6/1994 | Yamano et al. . |
| 5,417,798 | 5/1995 | Nishibayashi ............................ 216/67 |
| 5,430,355 | 7/1995 | Paranjpe ............................ 315/111.21 |
| 5,804,033 | 9/1998 | Kanai et al. ......................... 156/643.1 |

FOREIGN PATENT DOCUMENTS

| | | |
|---|---|---|
| 0 481 198 A2 | of 0000 | European Pat. Off. . |
| 0481198 A2 | 8/1991 | European Pat. Off. . |
| WO 94/02959 | of 0000 | WIPO . |
| 88/368640 | 12/1988 | WIPO . |
| 94/02959 | 2/1994 | WIPO . |

OTHER PUBLICATIONS

Neumann, G. et al, Characterization of a new electron cyclotron . . . Journal of Vacuum Science & Tech. 9 (1991) Mar./Apr. 334–338.

Neumann, G., Journal of Vacuum Science & Technology B 9 (1991) Mar./Apr., Nr.2, Prt I, New York, US pp. 334–338.

S.J. Pearton, A. Katz, F. Ren, and J. Lothian, Electronics Letters, 28, 822, (1992), ion beam irradiation.

N.N. Efremow, M. W. Geis, D.C. Flanders, G.A. Lincoln and N.P. Economou, J. Vac. Sci. Technol. B,3, 416, (1985) laser planing.

M. Yoshikawa, SPIE Diamond Optics III 1325 210–217 (1990).

S. Jin, J.E. Graebner, T.H. Tiefel and JG W. Kammlott, Diamond and Related Materials, 2, 1038, (1993).

K. Tankala, T. DebRoy and M. Alam, J. Mater. Res. 5, 2483, (1990).

J. Hopwood, D.K. Reinhard, and J. Asmussen, J. Vac. Sci, Technol. A, 8, 3103, (1990).

G. King, et al., J. Vac. Sci. Technol. A, 10, 1265 (1992).

F.C. Sze, et al., J. Vac. Sci. Technol. A, 11, 1289 (1993).

*Primary Examiner*—Michael P. Woodward
*Assistant Examiner*—Mary K Zeman
*Attorney, Agent, or Firm*—Ian C. McLeod

[57] ABSTRACT

A method for selective controlled etching of a material particularly by sequentially switching between two (2) or more modes of radiofrequency waves and/or by distance from a source of the microwaves. The modes and/or distance are selected depending upon the surface of the material to be etched. The etching is rapidly conducted at 0.5 mtorr to 10 torr, preferably using microwave plasma etching.

32 Claims, 7 Drawing Sheets

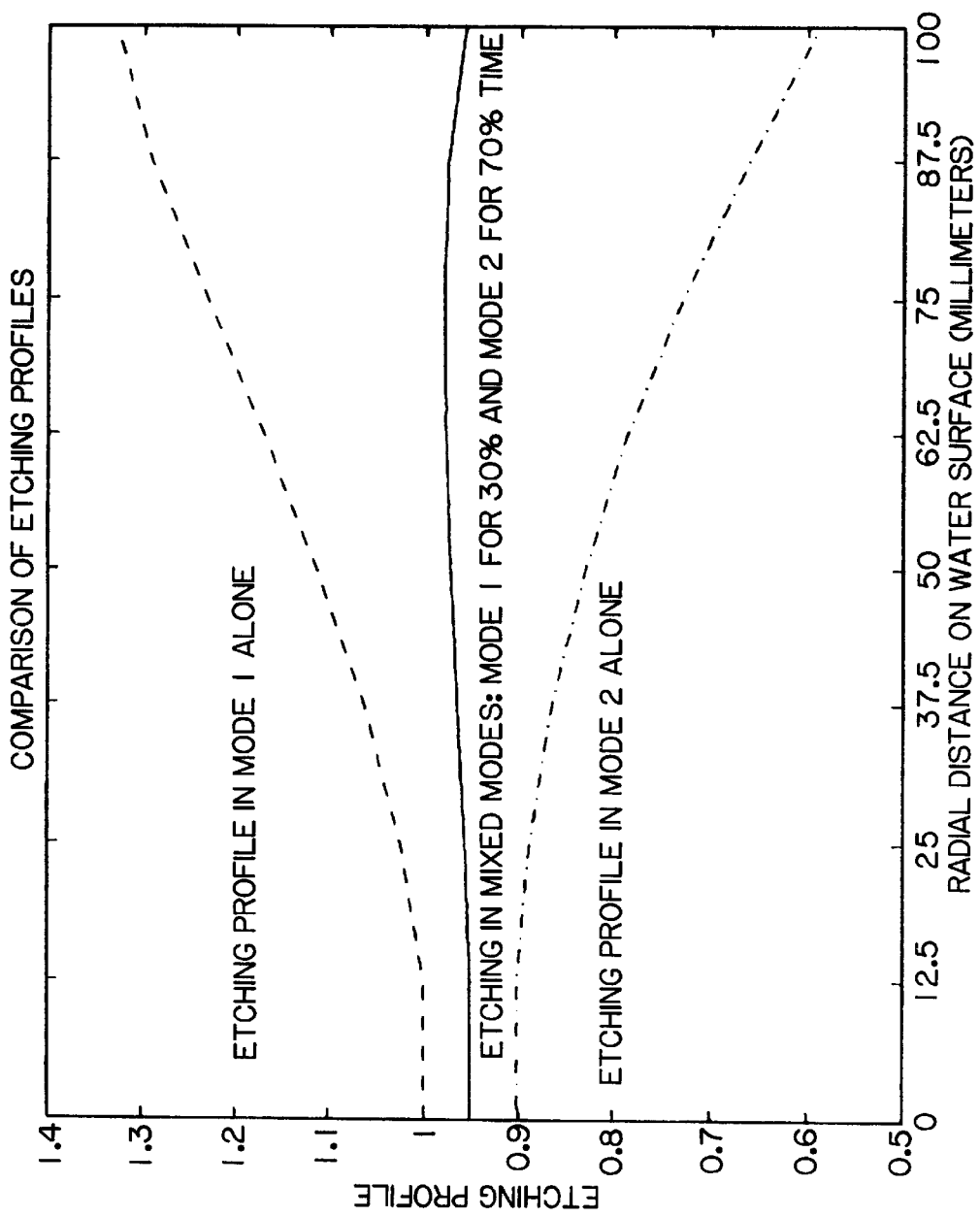

METHOD FOR RADIOFREQUENCY WAVE ETCHING

BACKGROUND OF THE INVENTION

(1) Field of the Invention

The present invention relates to an improved method for etching a surface of a material or workpiece using a radiofrequency wave RF, particularly a microwave, plasma reactor. In particular, the present invention relates to an improved method for plasma etching, including electron-cyclotron-resonance (ECR) plasma etching at pressures below about 10 torr of a surface of a diamond wafer to provide increased etch rate and improved uniformity of etching. This result is achieved particularly by changing resonant radiofrequency modes in the plasma reactor over time dependent upon the surface geometry of the particular wafer.

(2) Prior Art

As-grown, free-standing diamond wafers contain various degrees of surface roughness, bowing, and thickness variations which vary from wafer to wafer. Consequently, post-processing is required to achieve flat surfaces of uniform thickness. Presently, the diamond wafers are polished to a uniform thickness using mechanical means. The mechanical method achieves good results, but is slow. Various alternative methods have been investigated for diamond post-processing including plasma etching (S. J. Pearton, A. Katz, F. Ren, and J. R. Lothian, Electronics Letters, 28, 822, (1992)), ion beam irradiation, (N. N. Efremow, M. W. Geis, D. C. Flanders, G. A. Lincoln, and N. P. Economou, J. Vac. Sci. Technol. B, 3, 416, (1985)) laser planing, (M. Yoshikawa, SPIE Diamond Optics III 1325 210–217 (1990)) and diffusional reactions with hot metals (S. Jin, J. E. Graebner, T. H. Tiefel and J G W. Kammlott, Diamond and Related Materials, 2, 1038, (1993)). Pearton et al reported higher removal rates using plasma etching however the issue of uniformity was not addressed.

As-grown diamond wafers have radial thickness variations but have angular symmetry which vary from wafer to wafer. Some wafers are thickest in the center, some are thickest at the edges, and some are thickest at some radial point between the edge and center. Therefore, it is a significant challenge to achieve a high diamond removal or etch rate uniformly over large areas where there is a lack of uniformity of the surface irregularities for a given wafer and also from wafer to wafer. There remains a need for a method of polishing or etching a material which is fast, which allows for uniform etching over large diameters and which allows the etch profile to be customized for each material to be etched.

U.S. Pat. No. 5,081,398 to Asmussen et al describes an apparatus which can be used in the method of the present invention. Related patents are U.S. Pat. Nos. 5,311,103; 4,507,588 and 4,727,293 to Asmussen et al. Also, U.S. Pat. No. 4,691,662 to Roppel et al describes such apparatus. The method of the present invention uses the plasma technology described in these patents.

OBJECTS

It is therefore an object of the present invention to provide a method for controlling the etch rate profile across a material which is being treated by plasma etching. Further, it is an object of the present invention to provide a method for achieving a pre-selected final thickness of the material by plasma etching, and/or a predetermined etch depth and uniform or predetermined etch profile of patterned features such as for integrated circuits, particularly by the appropriate selection and combination of operating modes in a radiofrequency resonant cavity. Still further, it is an object of the present invention to provide a method which is relatively easy to perform and which is economical. These and other objects will become increasingly apparent by reference to the following descriptions and to the drawings.

BRIEF DESCRIPTION OF THE DRAWINGS

FIGS. 3, 4 and 5 are graphs of computer simulations showing the results with single modes (FIGS. 3 and 4) and a time sequenced combination of modes (FIG. 5).

DESCRIPTION OF THE PREFERRED EMBODIMENTS

The present invention relates to a method of selectively etching which comprises: determining how a surface of a material is to be selectively etched; providing the material to be etched in a plasma generated by radiofrequency waves in a confined space with the surface exposed to ions and free radicals from the plasma so that the ions and free radicals can etch the surface of the material; generating the plasma in the confined space so that the ions and free radicals etch the surface; and sequentially in time changing the characteristics of the plasma at the surface so as to selectively etch the surface of the material.

The present invention also relates to a method of etching which comprises: determining how different positions on an irregular surface of a material is to be etched; providing the material to be etched in a confined space in which a radiofrequency wave activated plasma is to be generated in a gaseous medium with the surface exposed to ions and free radicals from the plasma so that the ions and free radicals can etch the surface of the material; generating the plasma in the gaseous medium and directing the ions and free radicals so that the ions and free radicals etch the surface; and selecting sequentially in time at least two modes of the radiofrequency wave in the chamber dictated by the surface of the material so that the ions and free radicals etch the determined different positions on the surface of the material.

Further, the present invention relates to a method for plasma etching an irregular surface of a material with concentric raised portions and concentric depressed portions around a center of the surface of the material in order to make the irregular surface more planar which comprises: providing the material to be etched in a confined space in which a radiofrequency wave activated plasma is to be generated in a gaseous medium; generating the plasma in the gaseous medium at a pressure in the chamber between about 0.5 mtorr ($5 \times 10^{-3}$ torr) and 10 torr to produce ions and free radicals in the plasma which etch the material; selecting sequentially in time at least two modes of the radiofrequency wave in the chamber dictated by the concentric raised portions of the material so that the ions and free radicals etch the raised portions of the material more rapidly than the depressed portions of the material around the center to make the irregular surface more planar.

Figure 2A:
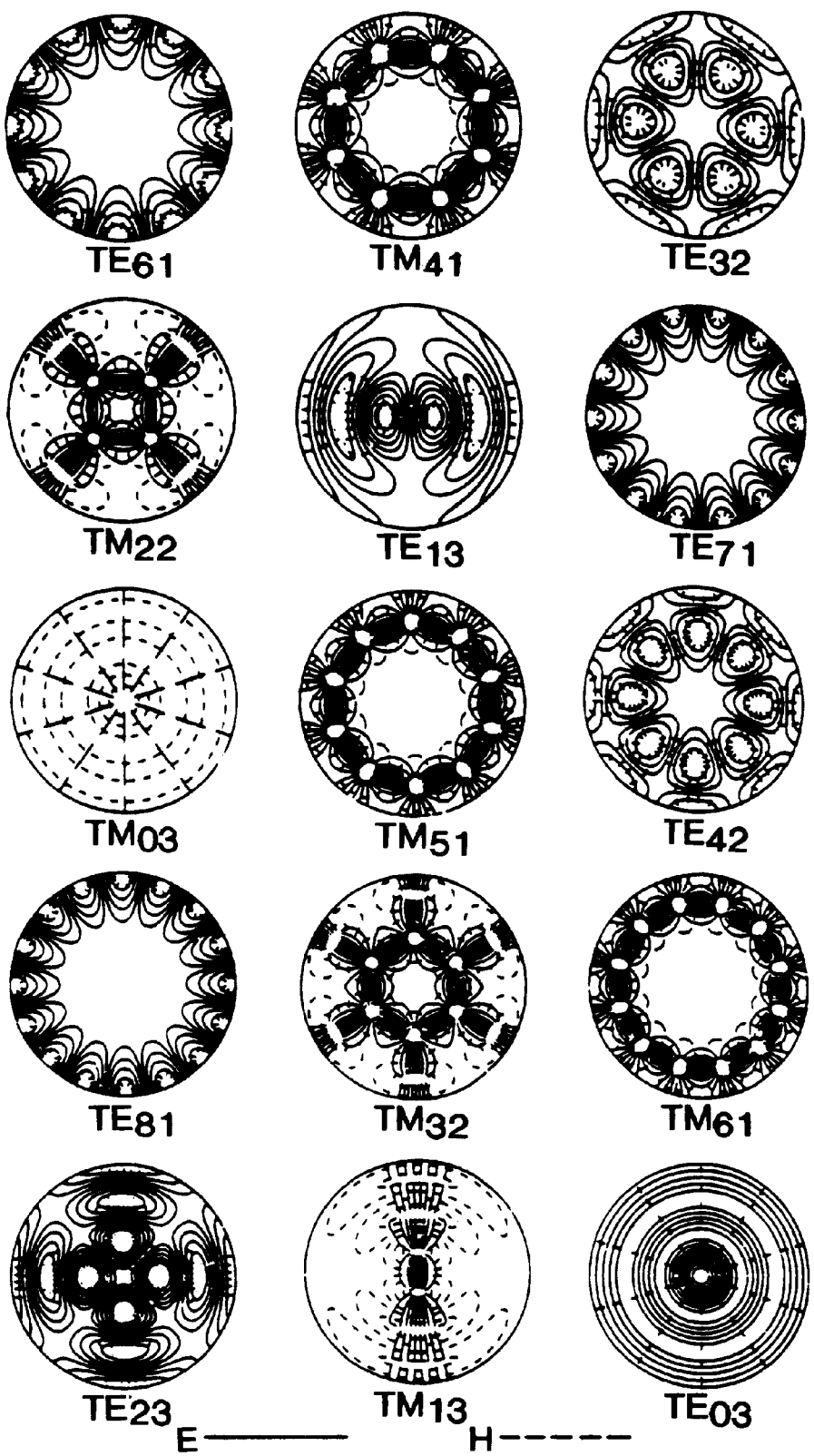
FIG. 2 shows various available modes in a cross-section of an empty circular cavity 11 of an apparatus as shown in FIGS. 1 and 1A.
Figure 2B:
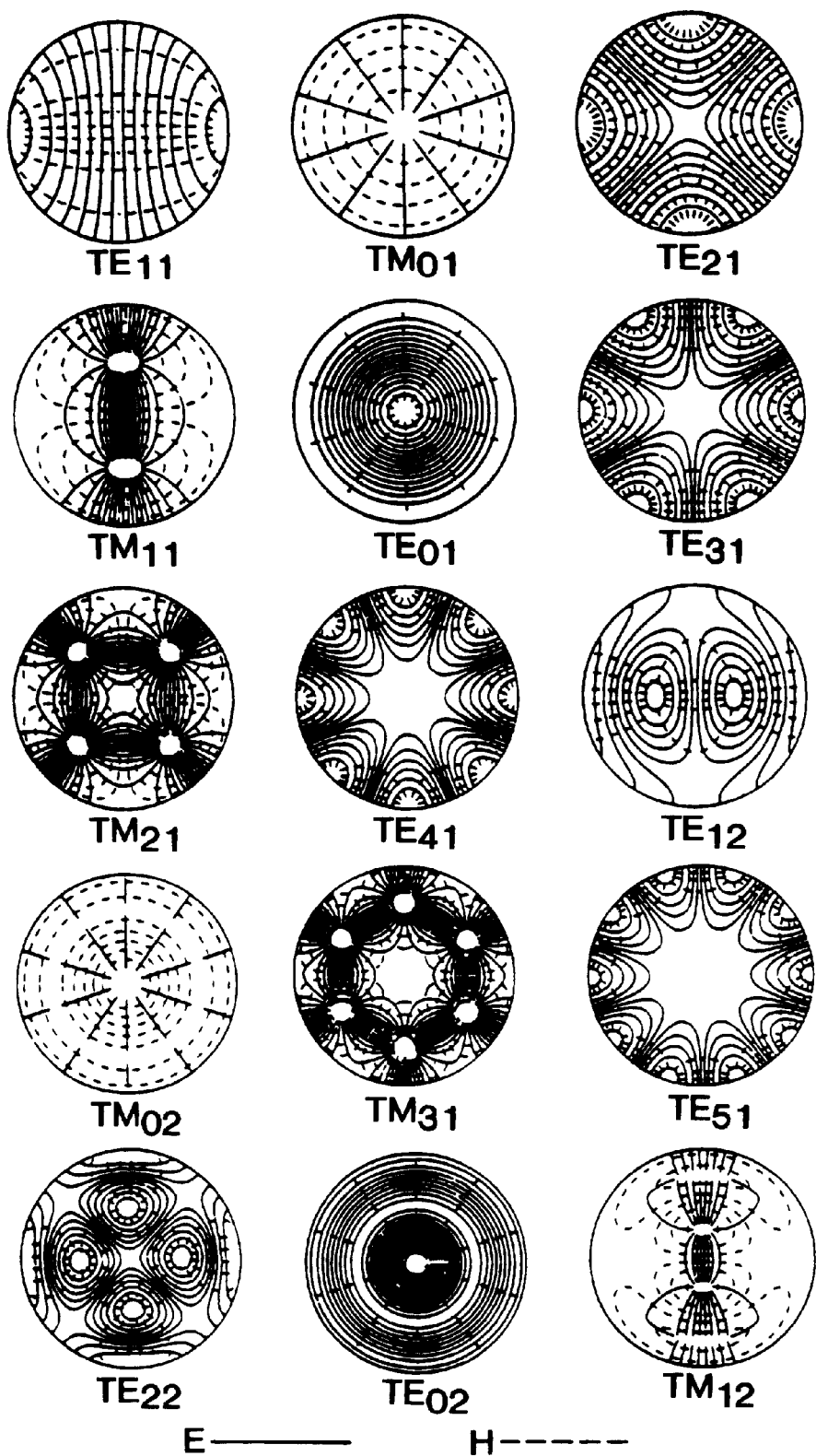

Considering the field patterns for the modes shown in FIG. 2, it is seen that the regions of intense fields vary considerably with excitation mode. Consequently, in the upstream region of the discharge zone, the spatial variation of plasma density varies considerably with mode. At low pressures, the mean free path of plasma species is large and non-uniformities in the plasma are largely washed out at downstream positions. However, when pressures greater than approximately 0.5 mtorr are used for diamond etching, the non-uniformities in the plasma contribute in part to etching non-uniformity. The mode selection for the etching is chosen to compensate for thickness non-uniformities in as-grown wafers. Modes are chosen to intentionally etch different portions of the substrate at different rates. Downstream from a chamber where the plasma is generated, plasma uniformity is also controlled by diffusion.

In one embodiment of the present invention, the mode is selected by varying the height of the resonant cavity with a sliding short. In an alternative embodiment, a variable excitation frequency is used to change the mode. Furthermore, multiple input probes can be used to cause irregular positioning of the excitation fields so as to remove asymmetry in the angular direction. When only one operating mode is used, the diamond removal rate is in excess of 5 $\mu$m/hour on 100 mm diameter substrates with uniformities of 29.7% standard deviation across a 100 mm diameter wafer. When three operating modes are used, the uniformity is improved to 6% standard deviation with a rate of 6 $\mu$m/hr.

Figure 1:
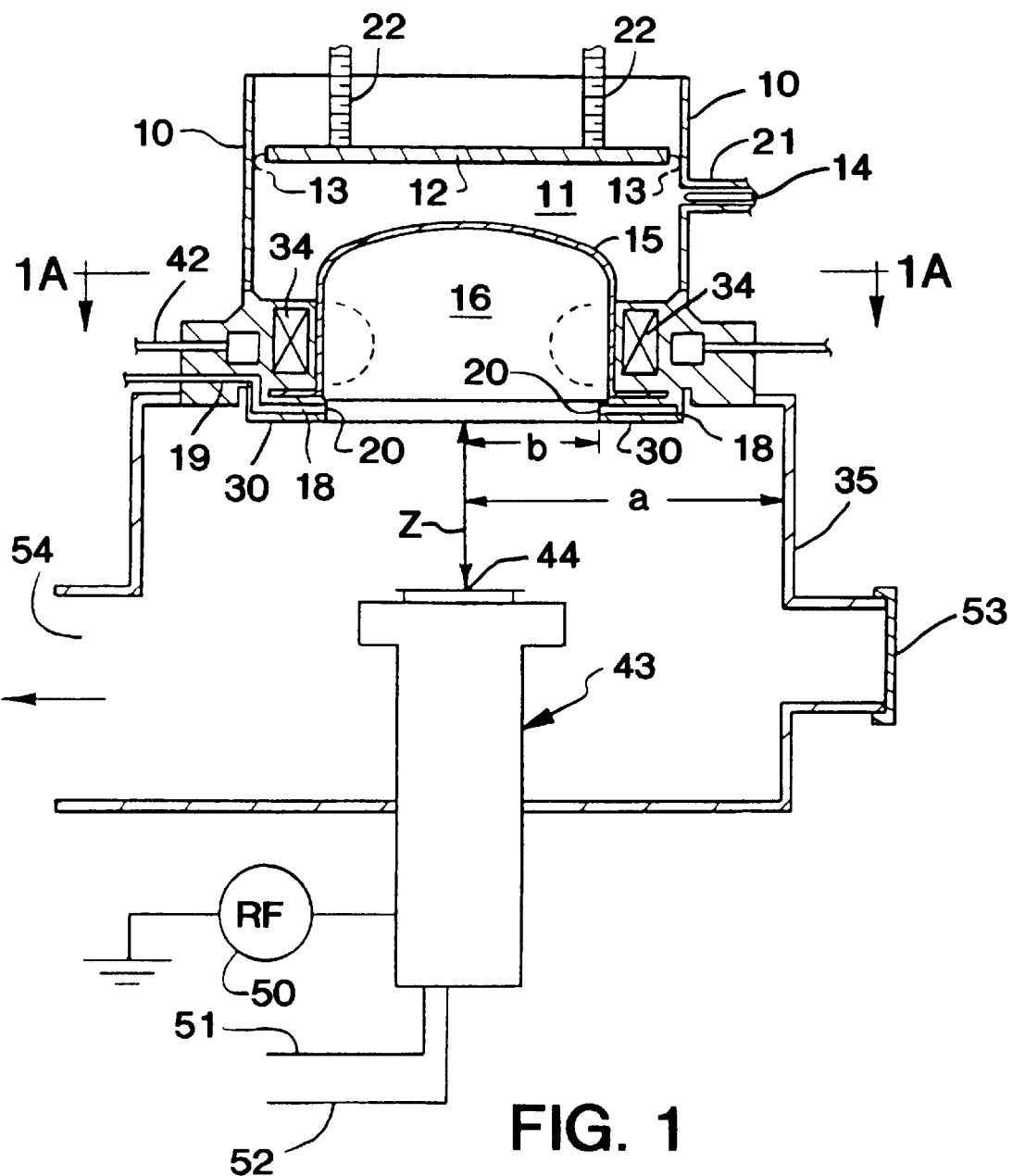
FIG. 1 is a front cross-sectional view of a radiofrequency wave coupling apparatus as described in the patent literature and as used in the method of the present invention.
Figure 1A:
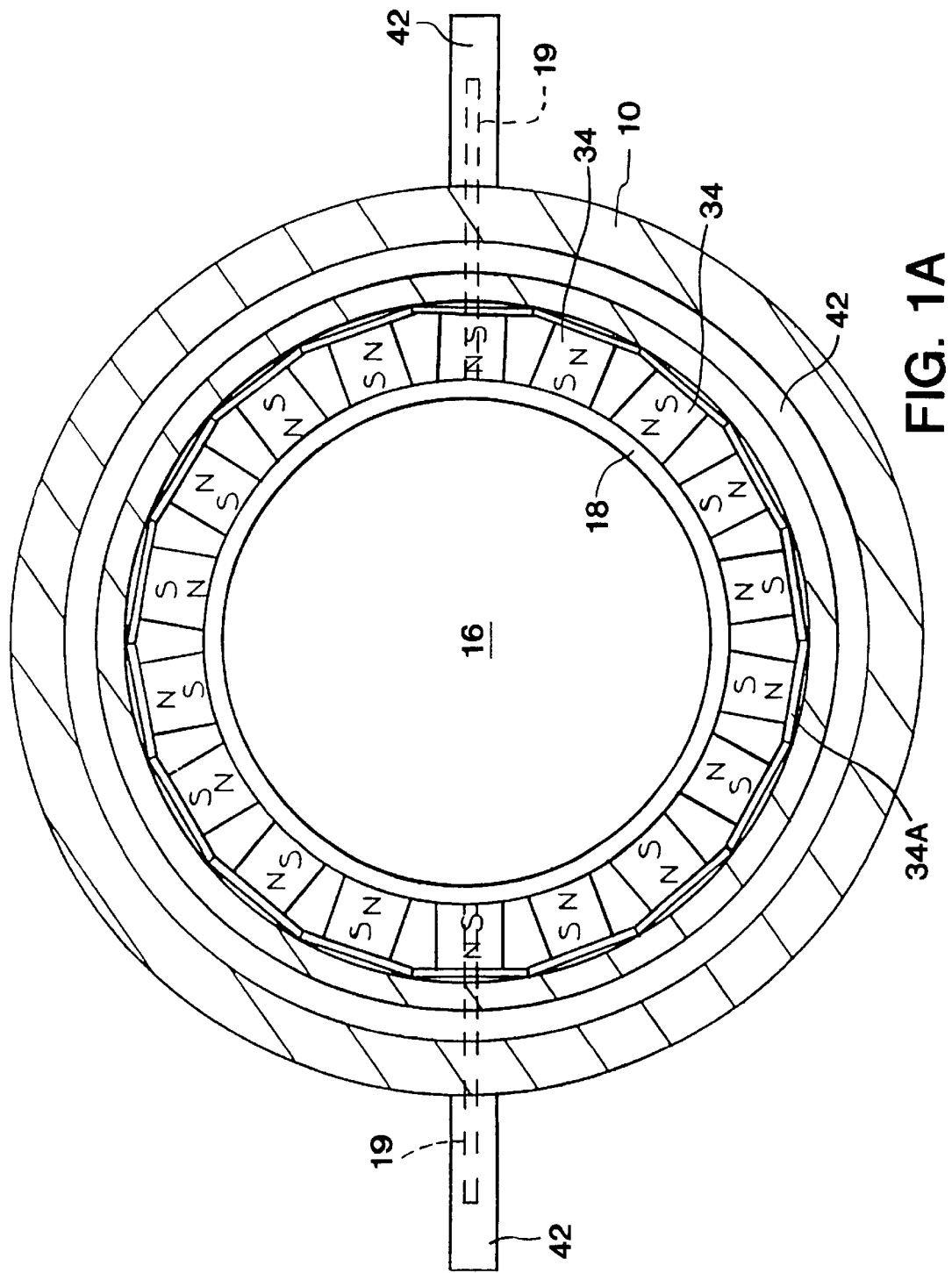
FIG. 1A is a plan cross-sectional view along line 1A—1A of FIG. 1 showing the plasma region 16 and ECR magnets 34 which are used for low pressure processing. The number of magnets can vary depending upon the size of the reactor and the conditions for forming and maintaining the plasma.

FIGS. 1 and 1A show the preferred plasma generating apparatus used in the method of the present invention. The basic construction of the apparatus is described in U.S. Pat. Nos. 4,507,588; 4,727,293; 5,081,398 and 5,311,103. The apparatus preferably includes a copper or brass cylinder 10 forming the microwave resonance cavity 11 with a copper or brass sliding short 12 for adjusting the length of the cavity 11. It will be appreciated that various non-magnetic materials can be used in the construction of the apparatus such as copper, brass, aluminum, silver, gold, platinum, non-magnetic stainless steel and the like. Silver plated copper brushes 13 are electrically in contact with the cylinder 10. The brushes 13 are provided entirely around the circumference of the sliding short 12; however, in FIG. 1, only two are shown. An axially moveable excitation probe or antenna 14 provides impedance tuning of the microwave energy in the cavity 11. The probe 14 is mounted in the sidewalls of the cavity 11 by a brass or copper conduit 21 or can be end mounted as shown in the Asmussen et al patents. Radial penetration of the probe 14 axially into the cavity 11 varies the RF coupling into the plasma in the cavity 11. The sliding short 12 is moved back and forth in cavity 11 to aid in tuning the microwave by rods 22 using conventional adjustment means (not shown) such as described in U.S. Pat. No. 4,507,588.

A quartz dish or chamber 15, preferably shaped like a round bottomed bowl, defines the plasma region 16 along with a stainless steel base 30. Gas is fed by a tube 19 to the annular ring 18 to the inlets 20 and then flows into the plasma region 16. Optionally a cooling line 42 is provided which cools the base 30. A vacuum chamber 35 is connected to the base 30 and provides the vacuum in the plasma region 16 using a vacuum system (not shown). The chamber 15 and plasma region 16 are surrounded by magnets 34 mounted on plates 34A such as described in U.S. Pat. No. 5,081,398. The magnets 34 generate multi-cusp ECR Zones. A substrate holder 43 preferably of anodized aluminum for supporting the material 44 (diamond wafer) is located at a variable distance below the plasma source in the vacuum chamber. The holder 43 is provided with an RF bias source 50 in order to develop a negative self-bias relative to the plasma and cooling lines 51 and 52. A loading port cover 53 is provided on the vacuum chamber 35. The vacuum system is provided at port 54 (not shown).

In the preferred method, the etching is performed using a commercially available plasma apparatus (Model MPDR 325i ECR Plasma Apparatus Source, Wavemat Inc., Plymouth, Mich.) operating with a fixed excitation frequency and fixed cavity 11 diameter 2.45 GHz and 12 inches respectively. The resonant mode of the apparatus is selected by tuning the height of the cavity 11 using the sliding short 12. The regions of intense plasma generation are determined by the interaction of the particular resonant mode which the cavity 11 is operated in and the position of the magnets 34. The plasma is contained in the quartz dish or chamber 15 which is preferably 25 cm in diameter. The gaseous medium from which the plasma is formed comprises $SF_6$, $O_2$, and Ar in various ratios. Microwave power, substrate bias, pressure, and gas composition flow rates of the three processing gases are varied depending upon the irregularities and size of wafer to be etched. In the preferred embodiment, the microwave input power is between 500 to 1100 W, the substrate RF bias is between about 85 to 120 V, and the pressure is between about 3 to 10 mtorr. Pressures between about 0.5 mtorr and 10 torr and bias voltages between about 85 and 300 VDC can be used. Preferably, the gas flows of Ar, $SF_6$ and $O_2$ are varied over the ranges 6–24 sccm, 1–6 sccm, and 2–45 sccm, respectively.

The etch rate is strongly dependent on substrate bias which indicates that energetic ions play a major role in the etching process. When only argon is used, a very small etch rate results which indicates that reactive ion etching is primarily responsible for diamond removal. In the preferred embodiment, the etch rate increases with increasing $O_2$ concentration and decreases with increasing $SF_6$ concentration, which indicates that the major etching activity is due to oxygen. However, without $SF_6$ a residual black surface layer, similar to that reported for partially oxidized diamond, (K. Tankala, T. DebRoy and M. Alam, J. Mater. Res. 5, 2483, (1990) is observed on the diamond surface after etching. Including a minimum of 2 sccm $SF_6$ to 28 sccm of oxygen (ratio 1:14) prevents such a layer from forming.

Etch rate increases with microwave input power, consistent with the fact that plasma density increases with power. A maximum in etch rate vs. pressure in the preferred embodiment occurs near 4 mtorr. The plasma density decreases with decreasing pressure (J. Hopwood, D. K. Reinhard, and J. Asmussen, J. Vac. Sci. Technol. A, 8, 3103, (1990)). Also, the plasma potential, and therefore incident ion energy, increases at decreasing pressures, below about 4 mtorr (G. King, et al., J. Vac. Sci. Technol. A, 10, 1265 (1992); and F. C. Sze, et al., J. Vac. Sci. Technol. A, 11, 1289 (1993)). A combination of these two effects produces the observed maximum in etch rate vs. pressure since the etch rate increases with plasma density and with ion energy. The etch rate is not a function of total flow rate for a given ratio of gases, since the etch rate is not sufficiently high to cause depletion of the gas phase etchant by reaction with the diamond.

In the preferred embodiment, the removal rates are approximately 10 to 20 times faster than the mechanical method and achieve uniformity over diameters of 100 mm or greater. Up to 200 micrometers have been removed with substantially less processing time than required by mechanical lapping. The etch rate can be controlled as a function of position of the material in the downstream position in order to compensate for variations in the thickness of the wafer.

In addition, the reactor geometry can be adjusted to control the rate of fall-off of etch rate from the center to edge of the wafer which is important when the wafer is thickest in the center. Specifically, the reactor operative size and the downstream substrate distance can be varied. Etching uniformity follows a ambipolar diffusion model, and is therefore determined by downstream distance and the size of the aperture 2b of the reactor. The diffusion profile, assuming a uniform plasma, is obtained from the expression for n(r,z) shown below, $$n(r, z) = N_o \left(\frac{2b}{a}\right) \sum_n \left(\frac{1}{x}\right) \frac{J_1\left(\frac{bx_n}{a}\right)}{(J_1(x_n))^2} \times J_0\left(\frac{rx_n}{a}\right) \exp(-kz)$$

where z, a and b are shown in FIG. 1 and r is the radial position. $N_o$ is the charge density at z=0 and r=0. $J_n$ is the nth order Bessel function of the first kind and $x_o$ is the nth zero of $J_o$.

The quantity k is given by $$k = \sqrt{\left(\frac{x_n}{a}\right)^2 - \frac{v_i}{D_a}}$$

where $D_a$ is the ambipolar diffusion coefficient and $v_i$ is the ionization frequency. By varying b and z by means of downstream distance, the rate of fall-off of etching from the center to the edge of the substrate can be adjusted.

COMPARATIVE EXAMPLE 1

A 100 mm diameter diamond wafer was etched in a microwave plasma disk 15 reactor as shown in FIGS. 1 and 1A, with a 30.5 cm diameter resonant cavity 11 and a 25.4 cm diameter quartz bell jar 15. Before and after, weight measurements are used to determine the total amount of diamond removed during the etching run, and therefore, the average etch rate across the wafer. Before and after, micrometer measurements are used to evaluate etching uniformity. With a resonant mode selected at 23.7 cm cavity 11 height for 100% of the etch time, etching was performed with an ECR plasma formed from a mixture of argon, oxygen, and sulfur hexafluoride. The bias on the wafer was 118 VDC. The resulting standard deviation in etch uniformity was 29%.

EXAMPLE 2

The same wafer as in Example 1 was etched with a mixture of three (3) different modes, specifically 46% of the time with 23.7 cm cavity 11 height, 27% of the time with 22.5 cm cavity 11 height, and 27% of the time with 24.8 cm cavity height. The bias was 118 VDC. There were 12 magnets rather than the 18 magnets shown in FIG. 1A. The resulting standard deviation in etch uniformity was 6%.

A computer simulation for the diffusion of plasma species from a spatially non-uniform source was carried out to demonstrate improved etching uniformity with mixed-mode etching. The following equation describes the diffusion of species from the source to the wafer placed at a downstream distance:

$$D_a \nabla^2(r,\phi,z) + v_i n(r,\phi,z) = 0$$

Figure 3:
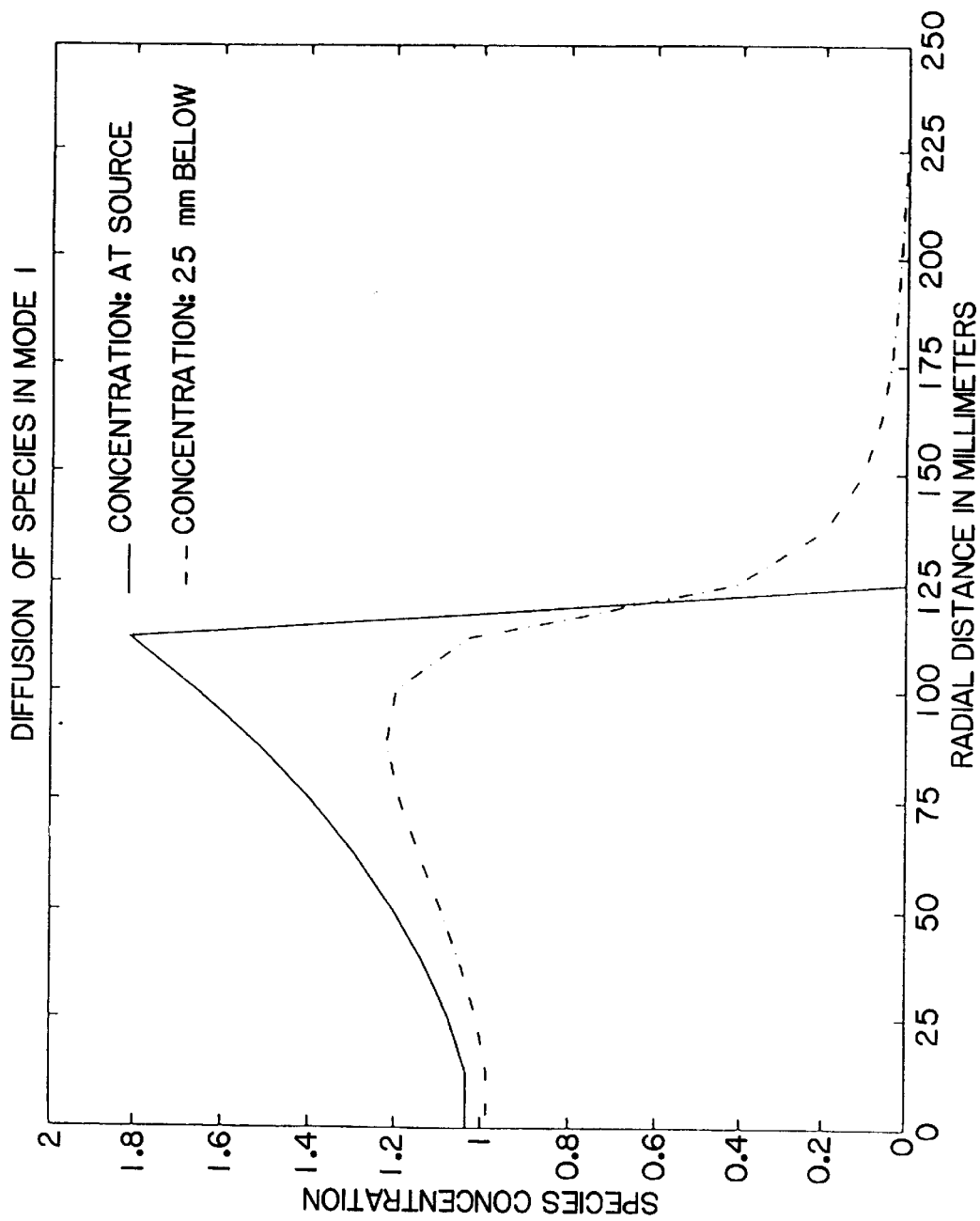
Figure 4:
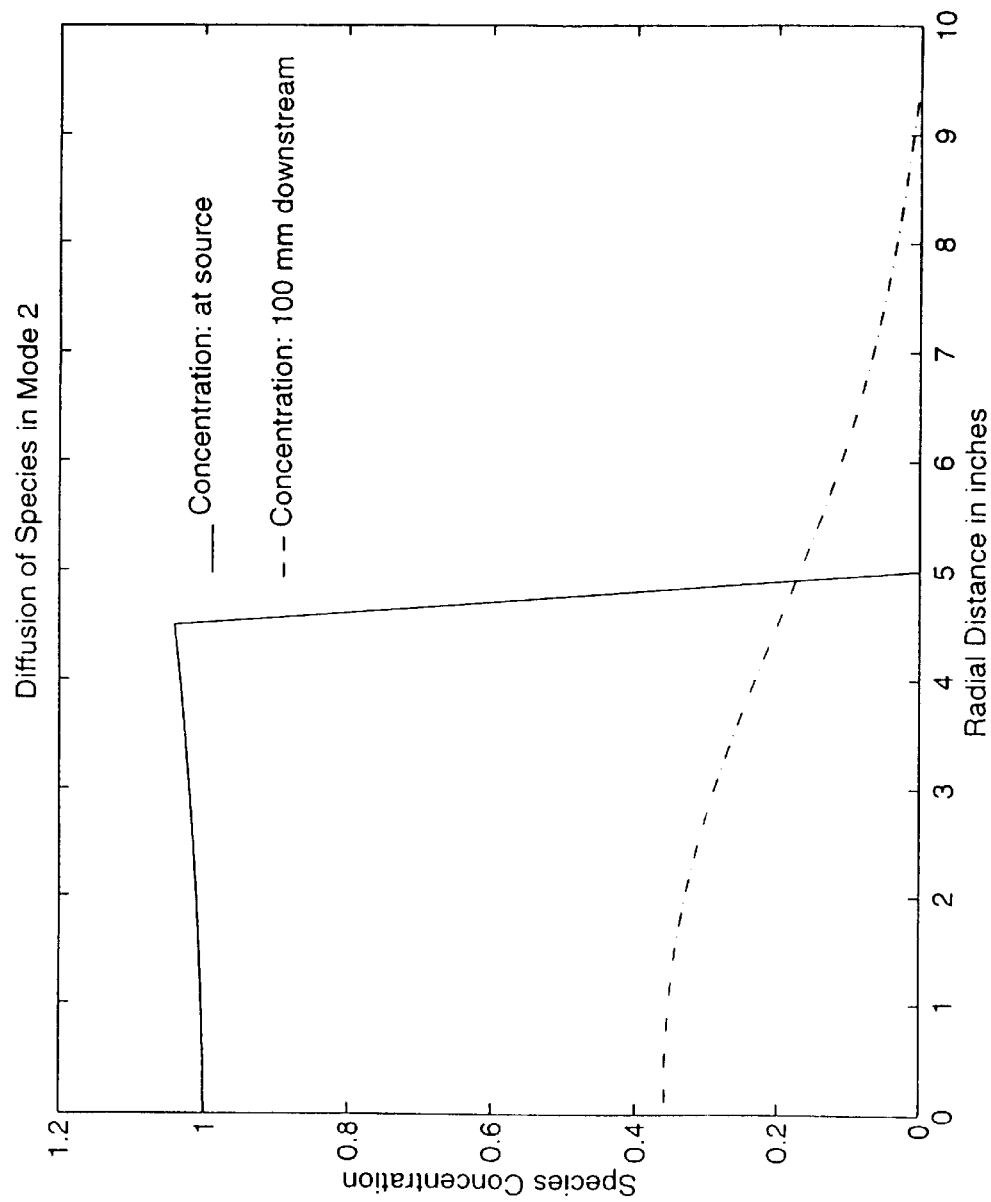

$D_a$, $v_i$, and n(r,ϕ,z) in the above equation are the ambipolar diffusion coefficient, the ionization frequency and the ion density, respectively. This ambipolar diffusion equation was solved numerically in a cylindrical coordinate system and the solution for the species concentration as a function of radial distance and downstream distance was determined. Higher etch uniformity can be obtained if etching is performed for a certain time with mode 1 at a downstream distance of 25 mm and a certain time with mode 2 at a downstream distance of 100 mm, than with the uniformity obtained from etching only with one of these modes. Mode 1 in this example represents a cavity resonant mode and pressure combination where the plasma density increases with the radial distance, for example a $TE_{21n}$ mode at a relatively high pressure, such as 20 mtorr. Mode 2 in this example represents a cavity resonant mode and pressure combination, for example a $TM_{01n}$ mode at a relatively low pressure, such as 2 mtorr, where plasma density is relatively uniform with radial distances. With appropriate choice of modes, pressure and the downstream distance, the etch rate profile can be controlled to either increase the etch uniformity or to preferentially remove material along the radial distance. The operation time at each mode, pressure and downstream distance also plays a crucial role. FIG. 3 shows the species concentration at the source and at 25 mm downstream distance for mode 1 and FIG. 4 shows the species concentration at the source and at 100 mm downstream distance for mode 2. The etch rate is proportional to the species concentration at the wafer surface. Considering a 200 mm diameter wafer, FIG. 5 shows a comparison of etch removal of mode 1, mode 2 alone and the sequential modes. The sequential mode etch profile, which shows higher etch uniformity across the surface of the wafer, is obtained from etching in mode 1 for 30% of total etch time at 25 mm downstream distance and in mode 2 for 70% of total time at 100 mm downstream distance. The percent variation in etch rate for mode 1 is 24.7%, for mode 2 is 34.8%, and for the sequential modes is 3.0%.

The method is useful for the finishing of free standing diamond wafers by making the surface more planar for use for electronic packaging purposes and for use for multiple small diamond pieces which are used for various applications including heat sinks and cutting tools. The method allows uniform removal of a diamond layer across a non-uniform disk so that the product is still non-uniform. This is important for controlling diamond stress in the workpiece and is not possible using other methods. Finally, the method allows uniform removal of a diamond layer from a uniform product. The method provides an increased manufacturing rate of diamond products.

Numerous variations will occur to those skilled in the art. It is intended that the foregoing descriptions be only illustrative of the present invention and that the present invention be only limited by the hereinafter appended claims.

We claim:

1. A method of selectively etching which comprises:
   (a) determining how a surface of a material is to be selectively etched;
   (b) providing the material to be etched in a plasma generated by radiofrequency waves in a confined space defined by a chamber with the surface exposed to ions and free radicals from the plasma directed towards the surface so that the ions and free radicals can etch the surface of the material, wherein a mode of the radiofrequency waves in the confined space is variable as a result of moving a distance of a tuning means from the chamber as a function of time to provide changing characteristics of the plasma;

(c) generating the plasma in the confined space so that the ions and free radicals selectively etch the surface in a first position with the tuning means in one position; and (d) sequentially in time changing the characteristics of the plasma at the surface so as to selectively etch the surface of the material in a second position by moving the tuning means in another position.

2. The method of claim 1 wherein at least two modes of the radiofrequency waves are provided in the chamber as a function of time to provide for the changing of the characteristics of the plasma.

3. The method of claim 1 wherein the plasma is generated in a chamber as the confined space and directed towards the surface of the material in the chamber, wherein a distance of the tuning means from the chamber is varied as a function of time to provide for the changing of the characteristics of the plasma and wherein at least two modes of the radiofrequency waves are provided in the chamber as a function of time to provide for the changing of the characteristics of the plasma.

4. The method of claim 1 wherein magnets are provided outside of the confined space which provide electron cyclotron resonance in the confined space.

5. A method of etching which comprises:

(a) determining how different positions on an irregular surface of a material is to be etched;

(b) providing the material to be etched in a confined space defined by a chamber in which a radiofrequency wave activated plasma is to be generated in a gaseous medium with the surface exposed to ions and free radicals from the plasma so that the ions and free radicals directed towards the surface can etch the surface of the material, wherein a mode of the radiofrequency waves in the confined space is variable as a result of moving a distance of a tuning means from the chamber as a function of time to provide changing characteristics of the plasma;

(c) generating the plasma in the gaseous medium and directing the ions and free radicals so that the ions and free radicals selectively etch the surface in a first position with the tuning means in one position; and (d) selecting sequentially in time at least two modes of the radiofrequency wave in the chamber dictated by the surface of the material so that the ions and free radicals etch a second position of the surface of the material by moving the tuning means in another position.

6. The method of claim 5 wherein the material is diamond.

7. The method of claim 5 wherein the material is shaped as a circular disc.

8. The method of claim 5 wherein the material is diamond which is shaped as a circular disc resulting from plasma assisted chemical vapor deposition of the diamond.

9. The method of claim 5 wherein the gaseous medium comprises oxygen.

10. The method of claim 5 wherein the gaseous medium comprises a mixture of sulfur hexafluoride, oxygen and argon.

11. The method of claim 5 wherein the modes are in addition selected by varying the frequency of the radiofrequency waves.

12. The method of claim 5 wherein the gaseous medium comprises sulfur hexafluoride and oxygen.

13. The method of claim 5 wherein a voltage bias is applied to a conductive support for the material positioned outside of the plasma so that the ion energy is increased in order to formulate etching the material.

14. The method of claim 5 wherein a distance of the surface of the material from a source of the plasma is varied along with the modes.

15. The method of claim 5 wherein magnets are provided outside of the confined space which provide electron cyclotron resonance in the confined space.

16. A method for plasma etching an irregular surface of a material with concentric raised portions and concentric depressed portions around a center of the surface of the material in order to make the irregular surface more planar which comprises:

(a) providing the material to be etched in a confined space in which a radiofrequency wave activated plasma is to be generated in a gaseous medium, wherein a mode of the radiofrequency waves in the confined space is variable and wherein magnets are provided outside of the confined space which provide electron cyclotron resonance in the confined space;

(b) generating the plasma in the gaseous medium at a pressure in the chamber between about 0.5 mtorr and 10 torr to produce ions and free radicals in the plasma which etch the material;

(c) selecting sequentially in time at least two modes of the radiofrequency wave in the chamber dictated by the concentric raised portions of the material so that the ions and free radicals selectively etch the raised portions of the material more rapidly than the depressed portions of the material around the center to make the irregular surface more planar.

17. The method of claim 16 wherein the material is diamond.

18. The method of claim 16 wherein the material is shaped as a circular disc.

19. The method of claim 16 wherein the gaseous medium for the etching comprises a mixture of sulfur hexafluoride, oxygen and argon at flow rates of 1 to 6 sccm of sulfur hexafluoride; 2 to 45 sccm oxygen and 6 to 24 sccm argon into the chamber.

20. The method of claim 16 wherein the material is diamond which is shaped as a circular disc resulting from plasma assisted chemical vapor deposition of the diamond.

21. The method of claim 20 wherein the gaseous medium for the etching is a mixture of sulfur hexafluoride, oxygen and argon at flow rates of 1 to 6 sccm of sulfur hexafluoride; 2 to 45 sccm oxygen and 6 to 24 sccm argon.

22. The method of claim 16 wherein there are three separate sequentially in time selected modes in the chamber.

23. The method of claim 16 wherein the modes are selected by a mode tuning means in a chamber for generating the radiofrequency wave.

24. The method of claim 16 wherein the radiofrequency waves are microwave, and the modes are selected by varying the frequency of the microwaves.

25. The method of claim 23 wherein the gaseous medium for the etching is a mixture of sulfur hexafluoride, oxygen and argon at flow rates of 1 to 6 sccm of sulfur hexafluoride, 2 to 45 sccm oxygen and 6 to 24 sccm argon.

26. The method of claim 25 wherein the material is diamond which is etched.

27. The method of claim 26 wherein the diamond is shaped as a circular disc.

28. The method of claim 16 wherein a voltage bias is applied to a conductive support for the material positioned outside of the plasma so that the ion energy is increased in order to formulate etching of the material.

29. The method of claim 28 wherein the voltage bias is a RF bias which induces essentially a DC voltage of about 50 and 300 volts.

30. The method of claim 16 wherein a distance of the surface of the material from a source of the plasma is varied along with the modes.

31. A method for plasma etching an irregular surface of diamond with concentric raised portions and concentric depressed portions around a center of the surface of the diamond in order to make the irregular surface more planar which comprises:

(a) providing the diamond to be etched in a confined space in which a radiofrequency wave activated plasma is to be generated in a gaseous medium wherein the medium for the etching comprises a mixture of sulfur hexafluoride, oxygen and argon at flow rates of 1 to 6 sccm of sulfur hexafluoride; 2 to 45 sccm oxygen and 6 to 24 sccm argon into the chamber;

(b) generating the plasma in the gaseous medium at a pressure in the chamber between about 0.5 mtorr and 10 torr to produce ions and free radicals in the plasma which etch the diamond;

(c) selecting sequentially in time at least two modes of the radiofrequency wave in the chamber dictated by the concentric raised portions of the diamond so that the ions and free radicals selectively etch the raised portions of the diamond more rapidly than the depressed portions of the diamond in first and second positions around the center to make the irregular surface more planar.

32. The method of claim 31 wherein the magnets are provided outside of the confined space which provide electron cyclotron resonance in the confined space.

* * * * *